(12) United States Patent
Mattii et al.

(10) Patent No.: US 11,929,325 B2
(45) Date of Patent: Mar. 12, 2024

(54) MIXED PITCH TRACK PATTERN

(71) Applicant: QUALCOMM Incorporated, San Diego, CA (US)

(72) Inventors: Luca Mattii, Youghal (IE); Sidharth Rastogi, Cork City (IE); Ranganayakulu Konduri, San Diego, CA (US); Gerard Patrick Baldwin, Cork (IE); Angelo Pinto, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 386 days.

(21) Appl. No.: 17/405,860

(22) Filed: Aug. 18, 2021

(65) Prior Publication Data

US 2023/0057276 A1    Feb. 23, 2023

(51) Int. Cl.
*H01L 21/00* (2006.01)
*H01L 23/528* (2006.01)

(52) U.S. Cl.
CPC ............................... *H01L 23/5286* (2013.01)

(58) Field of Classification Search
CPC ............... H01L 23/5286; H01L 23/528; H01L 27/0207
See application file for complete search history.

(56) References Cited

U.S. PATENT DOCUMENTS

| | | | | |
|---|---|---|---|---|
| 9,070,552 B1 * | 6/2015 | Shah | ................... | H01L 27/0207 |
| 11,461,521 B2 * | 10/2022 | Azmat | ................. | H01L 27/0207 |
| 11,726,184 B2 * | 8/2023 | Ferreira | ................. | G01S 7/4815 |
| | | | | 356/4.01 |
| 2014/0183659 A1 * | 7/2014 | Allen | .................... | H01L 23/528 |
| | | | | 257/392 |
| 2018/0113975 A1 * | 4/2018 | Sherazi | ............... | H01L 27/1203 |
| 2018/0314785 A1 * | 11/2018 | Schultz | ............. | H01L 27/11807 |
| 2019/0392108 A1 * | 12/2019 | Hanchinal | ............ | G06F 30/392 |
| 2020/0057830 A1 * | 2/2020 | Azmat | .................. | G06F 30/398 |
| 2020/0135644 A1 * | 4/2020 | Lin | ........................ | H01L 23/528 |
| 2021/0159163 A1 * | 5/2021 | Liff | ..................... | H01L 23/53228 |
| 2022/0115405 A1 * | 4/2022 | Lim | ...................... | G06F 30/394 |
| 2022/0130745 A1 * | 4/2022 | Kellam | ................... | H01L 24/06 |
| 2022/0208678 A1 * | 6/2022 | Schultz | ............... | H01L 23/5226 |
| 2022/0230954 A1 * | 7/2022 | Wang | .................. | H01L 23/5226 |
| 2023/0014110 A1 * | 1/2023 | Ou | ........................ | G06F 30/394 |
| 2023/0015367 A1 * | 1/2023 | Azmat | .................. | G06F 30/327 |

(Continued)

FOREIGN PATENT DOCUMENTS

| | | | | | |
|---|---|---|---|---|---|
| CN | 106952900 | A | * | 7/2017 | ........... H01L 23/528 |
| CN | 111244064 | A | * | 6/2020 | |

(Continued)

OTHER PUBLICATIONS

International Search Report and Written Opinion—PCT/US2022/073918—ISA/EPO—dated Nov. 14, 2022.

*Primary Examiner* — Laura M Menz

(74) *Attorney, Agent, or Firm* — Muncy, Geissler, Oids & Lowe, P.C./Qualcomm Incorporated

(57) ABSTRACT

Routing layers, e.g., back-end of line (BEOL) routing layers, of a semiconductor device are disclosed. Unlike conventional routing layers, the proposed routing layers include mixed pitch track patterns. As such, routing layers with reduced resistance-capacitance (RC) and low routing cost may be achieved.

24 Claims, 11 Drawing Sheets

(56) References Cited

U.S. PATENT DOCUMENTS

| | | | |
|---|---|---|---|
| 2023/0022681 A1* | 1/2023 | Rastogi | G06F 30/3953 |
| 2023/0057276 A1* | 2/2023 | Mattii | H01L 27/0207 |
| 2023/0068716 A1* | 3/2023 | Kang | H01L 23/5286 |
| 2023/0080522 A1* | 3/2023 | Beyne | H01L 23/5286 |
| | | | 257/691 |

FOREIGN PATENT DOCUMENTS

| | | | | |
|---|---|---|---|---|
| CN | 113053873 A | * | 6/2021 | G06F 30/394 |
| CN | 114514604 A | * | 5/2022 | H01L 23/5226 |
| DE | 102017115967 A1 | * | 5/2018 | G06F 30/392 |
| WO | WO-2021070366 A1 | * | 4/2021 | H01L 23/5226 |
| WO | 2022076060 | | 4/2022 | |
| WO | WO-2022076060 A2 | * | 4/2022 | G06F 30/394 |
| WO | WO-2023023432 A1 | * | 2/2023 | H01L 23/5286 |

* cited by examiner

US 11,929,325 B2

MIXED PITCH TRACK PATTERN

FIELD OF DISCLOSURE

This disclosure relates generally to semiconductor devices, and more specifically, but not exclusively, to mixed pitch track patterns, e.g., for resistance-capacitance (RC) reduction with low routing cost.

BACKGROUND

Integrated circuit technology has achieved great strides in advancing computing power through miniaturization of active and passive components. The package devices can be found in many electronic devices, including processors, servers, radio frequency (RF) integrated circuits, etc. Packaging technology becomes cost-effective in high pin count devices and/or high production volume components.

For advanced complementary metal-oxide-semiconductor (CMOS) technologies, back end of line (BEOL) resistance and capacitance (RC), e.g., in routing layers, has become a key bottleneck for power and performance scaling. For example, up to 40% of delay is can be due to wire delay for wire dominated blocks.

Accordingly, there is a need for systems, apparatus, and methods that overcome the deficiencies of conventional routing layers including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary semiconductor device is disclosed. The semiconductor device may comprise a routing layer comprising a first track set and a second track set. The first track set may comprise a plurality of first tracks and the second track set may comprise a plurality of second tracks. Within the first track set, a pitch between each pair of adjacent first tracks may be a first pitch. Within the second track set, a pitch between each pair of adjacent second tracks may be a second pitch greater than the first pitch. The routing layer may be a layer within a same intellectual property (IP) block.

A method of fabricating a semiconductor device is disclosed. The method may comprise forming a routing layer comprising a first track set and a second track set. The first track set may comprise a plurality of first tracks and the second track set may comprise a plurality of second tracks. Within the first track set, a pitch between each pair of adjacent first tracks may be a first pitch. Within the second track set, a pitch between each pair of adjacent second tracks may be a second pitch greater than the first pitch. The routing layer may be a layer within a same intellectual property (IP) block.

Other features and advantages associated with the apparatus and methods disclosed herein will be apparent to those skilled in the art based on the accompanying drawings and

DETAILED DESCRIPTION

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1A:
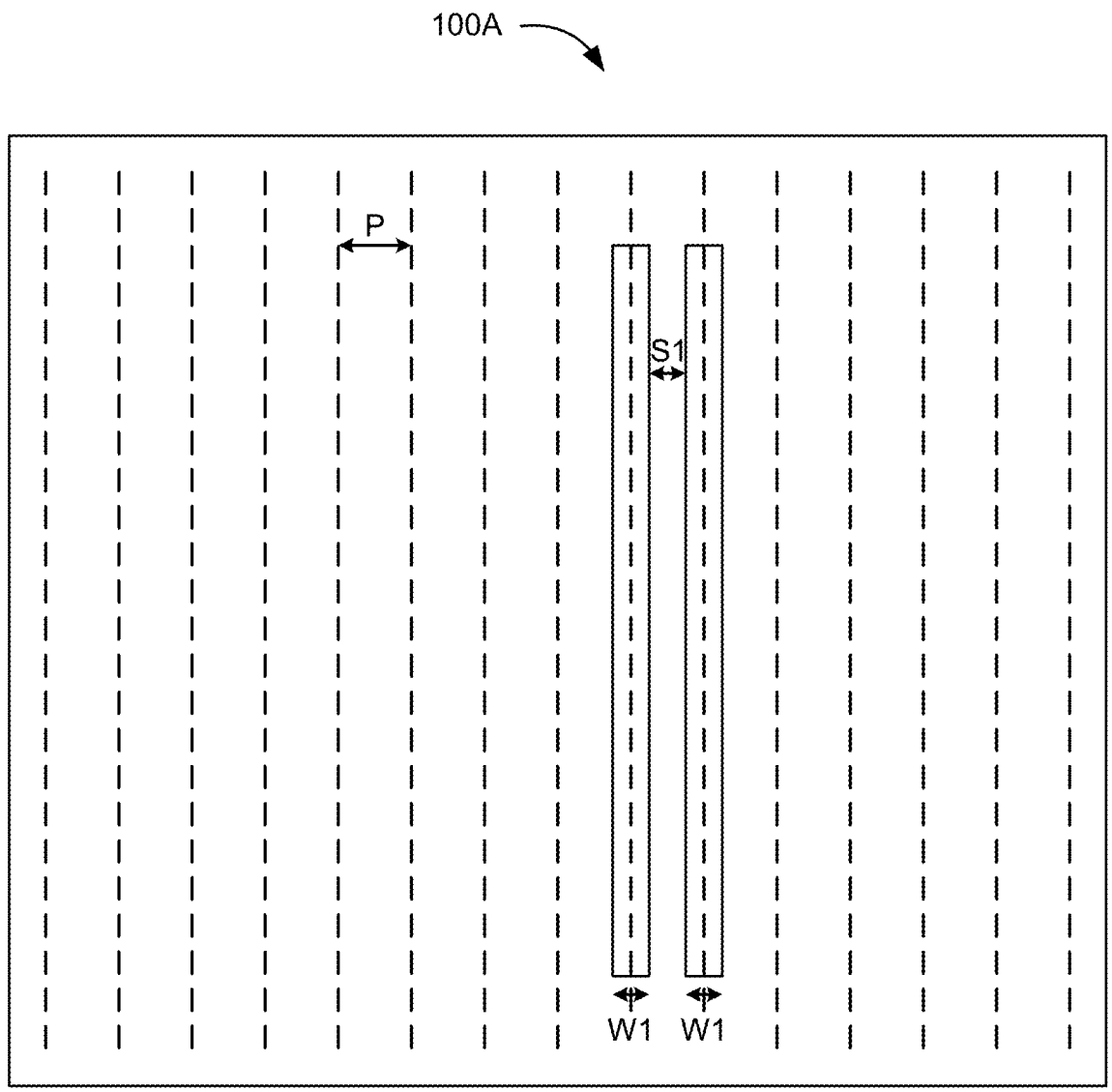
FIGS. 1A and 1B illustrate examples of conventional routing layers with fixed pitches.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting As used herein, the singular forms "a," "an," and "the" are intended to include the plural forms as well, unless the context clearly indicates otherwise. It will be further understood that the terms "comprises," "comprising,"

"includes," and/or "including," when used herein, specify the presence of stated features, integers, steps, operations, elements, and/or components, but do not preclude the presence or addition of one or more other features, integers, steps, operations, elements, components, and/or groups thereof.

As indicated above, back end of line (BEOL) resistance and capacitance (RC), e.g., in routing layers, has become a key bottleneck for power and performance scaling. For example, up to 40% of delay is can be due to wire delay for wire dominated blocks. The choice of the metal stack can therefore be a key enabler to optimally balance the trade-off between routing resources and RC reduction. This is typically achieved using the most advanced patterning (multiple patterning or extreme ultraviolet lithography (EUV)) on the lowest layers, where pitches will be lower, and single print litho etch (LE) lithography on the upper layers.

Currently, the track pattern on each layer uses a uniform and mostly unidimensional pattern where the pitch choice is fixed, and a given width/spacing (W/S) ratio is applied. That is, leading foundries currently offer metal stacks where each routing layer has a fixed pitch. FIG. 1A illustrates an example of a conventional routing layer 100A in which pitch between each pair of adjacent tracks is fixed to a minimum pitch P. Choosing the pitch equal to the minimum pitch P allowed by patterning is beneficial for alleviating congestion. However, the minimum pitch adversely affects power and performance.

Figure 1B:
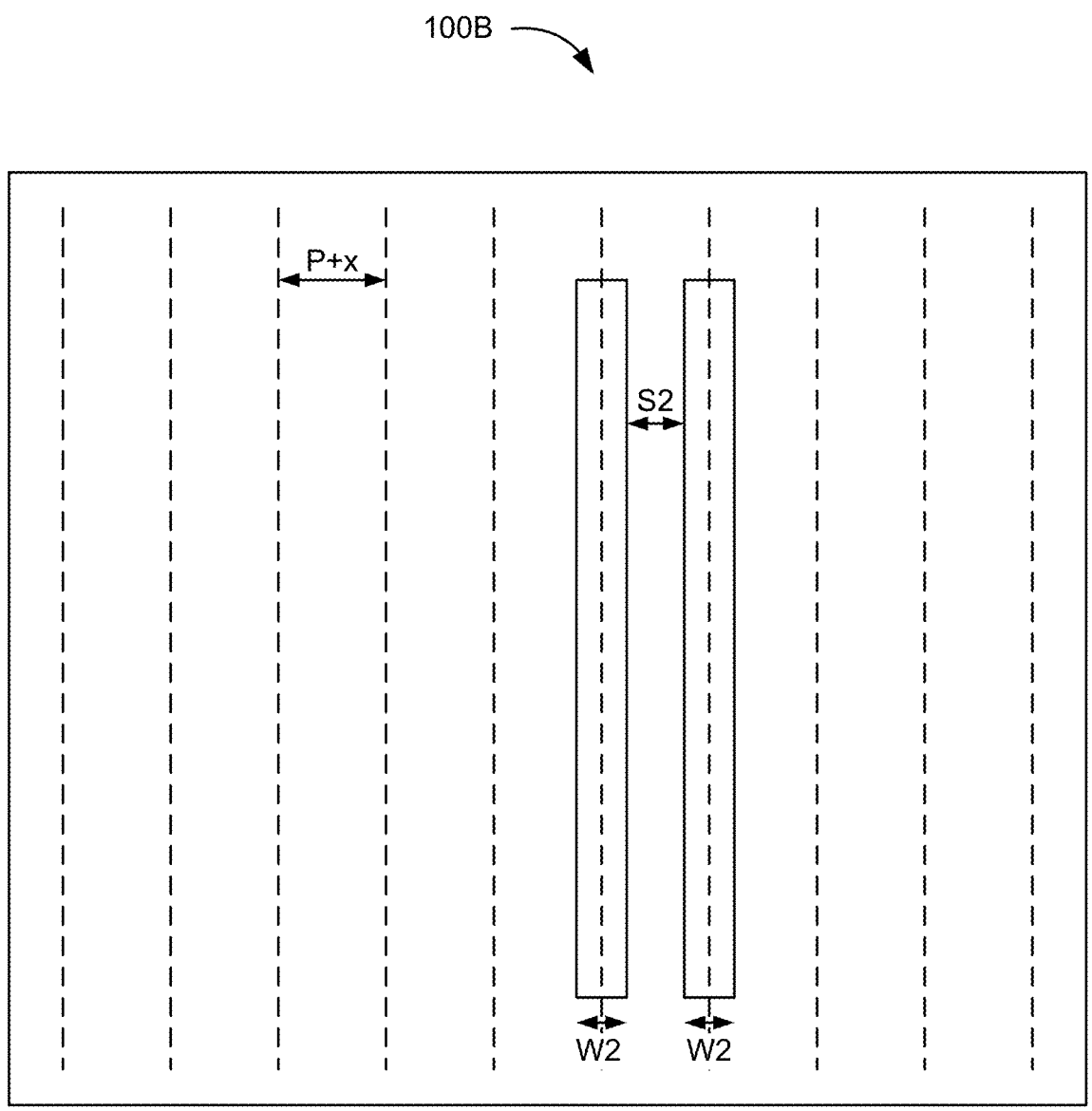

On the other hand, the minimum pitch can be relaxed, e.g., for power and performance reasons. FIG. 1B illustrates another example of conventional routing layer 100B. In this example, the pitch is relaxed by x nm. That is, in FIG. 1B, the pitch between each pair of adjacent tracks is fixed to a pitch P+x. Unfortunately, when the pitch is relaxed, it can result in increased congestion, that adversely affects area and potentially cancels the electrical benefits of reduced RC. Similar to FIG. 1A, the pitch in FIG. 1B is fixed.

Not that W/S ratio also plays a role in the resistance versus capacitance trade-off. For example, In FIG. 1A, the width of each track is fixed to W1, which also fixes the spacing S between each pair of adjacent tracks to S1, implying that the W/S ratio of FIG. 1A is also fixed to W1/S1. Similarly, in FIG. 1B, the width and spacing of the tracks are fixed to W2 and S2 effectively fixing the W/S ratio top W2/S2. Increasing this ratio may benefit resistance while compromising capacitance and vice versa.

To address some or all issues associated with conventional track patterns, it is proposed to utilize a mixed pitch approach on the same routing layer, within the same IP block. Subsystems (e.g., CPU, GPU, etc.) of a system-on-chip (SoC) may be viewed as examples of an IP block. Lower pitch patterns provide more routing resources, which translates into better area usage, while larger pitch patterns offer less resistive and capacitive interconnects, with consequent timing and power benefits. With the mixed pitch approach, on the same layer and/or within the same IP block, larger pitches may be used where electrical optimization may be more critical, and tighter pitches may be used where possible for area recovery.

Figure 2:
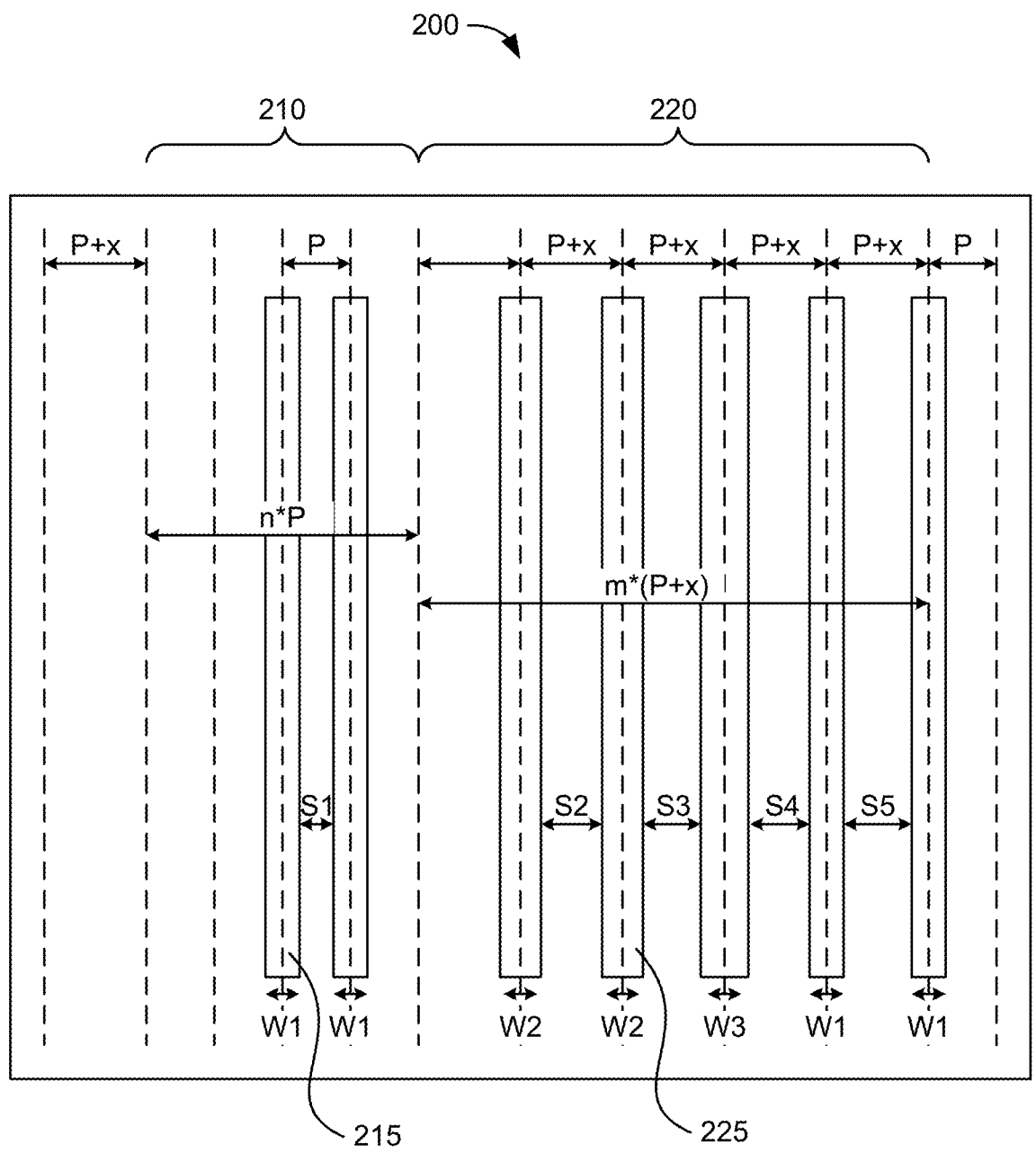
FIGS. 2-7 illustrates examples of routing layers, e.g., of a semiconductor device, with mixed pitches in accordance with one or more aspects of the disclosure.

FIG. 2 illustrates an example of a routing layer 200 with mixed pitches in accordance with one or more aspects of the disclosure. The routing layer 200 may be one of one or more routing layers of a semiconductor device. Here, the single routing layer 200 (e.g., within a same IP block) may comprise multiple track sets including first and second track sets 210, 220. Each track set may include a plurality of tracks. For example, the first track set 210 may include a plurality of first tracks 215, and the second track set 220 may include a plurality of second tracks 225.

Within the first track set 210, a pitch between each pair of adjacent first tracks 215 may be a first pitch P1, and a pitch between each pair of adjacent second tracks 225 may be a second pitch P2. In this instance, it may be assumed that the second pitch P2 is greater than the first pitch P1. For example, the first pitch P1 may be P and the second pitch P2 may be P+x, in which P may be a minimum pitch allowed in patterning, e.g., by a foundry. In an aspect, 0<x<P. That is, the second pitch P2 may not be an integer multiple of the first pitch P1. More generically, assume that the first pitch P1 may be represented as P+x1 and the second pitch p2 may be represented as P+x2. Then the relationship between x1 and x2 maybe 0<x1<x2<P.

The first track set 210 may include n first tracks 215 and the second track set 220 may include m second tracks 225. That is, the first track set 210 may be nP wide, and the second track set 220 may be m(P+x) wide. Within each track set, it may be assumed that the pitches between all pairs of adjacent tracks may be the same within that track set. For example, as indicated above, the pitches between all pairs of adjacent first tracks 215 may be P, and pitches between all pairs of adjacent second tracks 225 may be P+x.

With the narrower pitch, the first tracks 215 may be configured to route signals where resistance, capacitance, electromigration IR (EMIR), power, etc. is less of a concern. On the other hand, the wider pitched second tracks 225 may be used where such issues are more of significant concern.

In an aspect, a width of at least one first track 215 may be W1 and a width of at least one second track may be W2. The second width W2 may be wider than the first width W1. In another aspect, a spacing between at least one pair of adjacent first tracks 215 may be a first spacing S1, and a spacing between at least one pair of adjacent second tracks 225 may be a second spacing S2. The second spacing S2 may be greater than the first spacing S1. In a further aspect, a W/S ratio of at least one first track 215 may be a first W/S ratio, and a W/S ratio of at least one second track 225 may be a second W/S ratio. The second W/S ratio may be greater than the first W/S ratio. Note that a W/S ratio of a track may be defined as a ratio of a width of the track to a spacing between the track and an adjacent track.

While the pitch within each track set may be the same, the widths of the tracks need not be the same. That is, a width of a track within a track set may be same as or different from a width of another track within the same track set. For example, in FIG. 2, two second tracks 225 are have widths W2, one second track 225 has a width W3, and two other second tracks 225 have widths W1. To state it another way, within the second track set 220, a second width (e.g., W2) of one second track 225 may be different from a second width (e.g., W3) of another second track 225. Alternatively, or in addition thereto, the first tracks 215 of the first track set 210 may also have different widths (not shown). That is, within the first track set 210, a first width of one first track 215 may be different from a width of another first track 215.

Similarly, the spacings within a track set need not be the same. That is, a spacing between one pair of adjacent tracks within a track set may be same as or different from a spacing between another pair of adjacent tracks within the same track set. For example, in FIG. 2, there are spacings S2, S3, S4 and S5 between different pairs of adjacent second tracks 225. To state it another way, within the second track set 220, a second spacing (S2) between one pair of adjacent second tracks 225 may be different from a second width (e.g., S3) of another pair of adjacent second tracks 225. Alternatively, or in addition thereto, the spacings between different pairs of adjacent first tracks 215 of the first track set 210 may also have different spacings (not shown). That is, within the first track set 210, a first spacing between one pair of adjacent first tracks 215 may be different from a first spacing between another pair of adjacent first tracks 215.

Further, the W/S ratios within a track set need not be the same. That is, a W/S ratio of a track within a track set may be same as or different from a W/S ratio of another track within the same track set. Recall that the W/S ratio of a track may be defined as a ratio of a width of the track to a spacing between the track and an adjacent track. For example, in FIG. 2, within the second track set 220, a second W/S ratio of one second track 225 (e.g., W2/S2) may be different from a second W/S ratio of another second track 225 (e.g., W2/S3). Alternatively, or in addition thereto, the first tracks 215 of the first track set 210 may also have different W/S ratios (not shown). That is, within the first track set 210, a first W/S ratio of one first track 215 may be different from a first W/S ratio of another first track 215.

Figure 3:
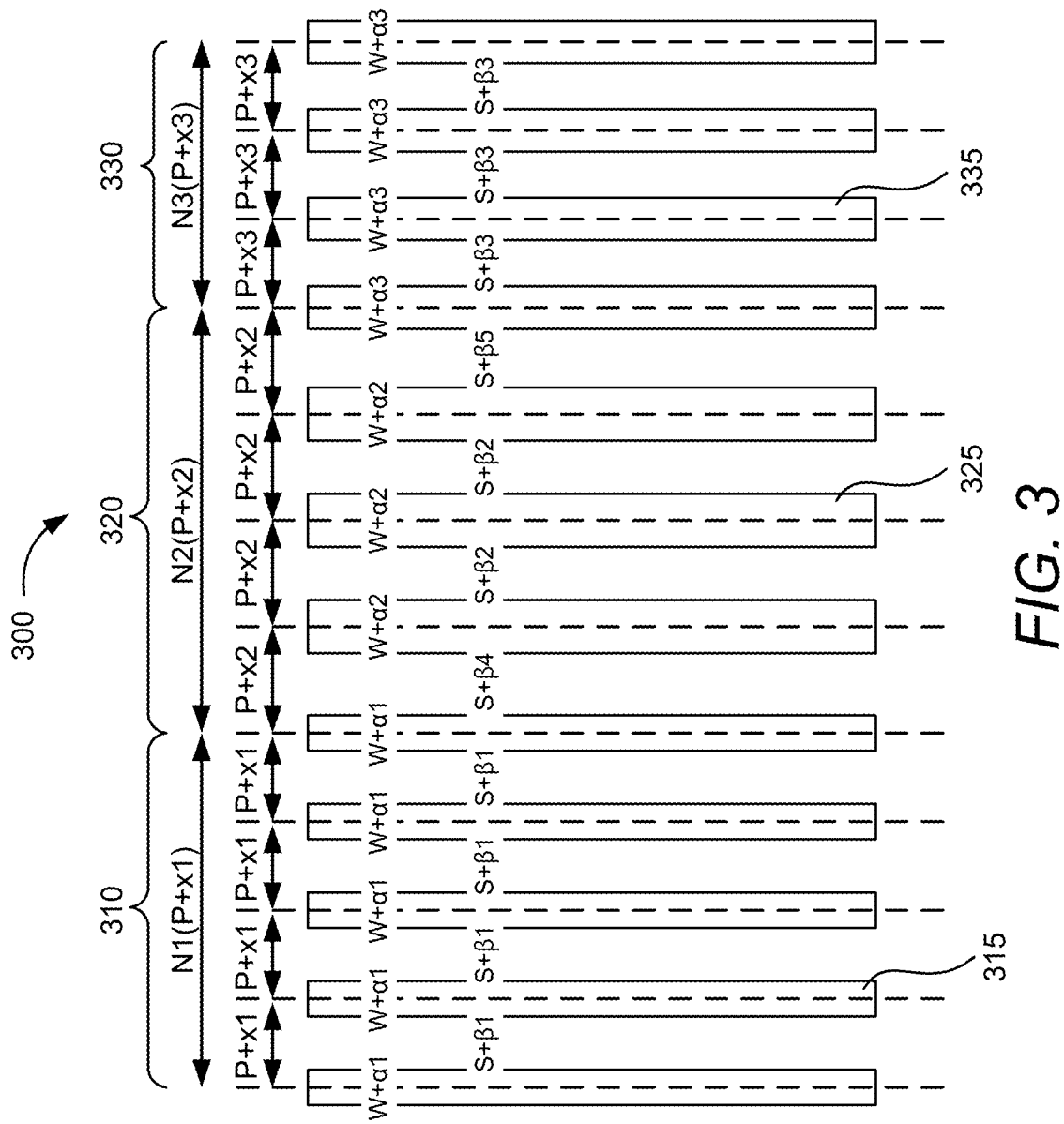

FIG. 3 illustrates another of a routing layer 300 with mixed pitches in accordance with one or more aspects of the disclosure. The routing layer 300 may be viewed as a more generalized version of a routing layer. Assume the following constraints:

P represents a minimum pitch allowed by patterning;
S represents a minimum spacing on a given routing layer; and
W represents a minimum width on a given layer.

Then on the given layer, the following variables may be adjusted:

$x_i$—pitch adjustment;
$\alpha_j$—spacing adjustment;
$\beta_k$—width adjustment; and
$N_h$—number of tracks of a track set.

Multiple pitches $P+x_i$ may be adjusted by the designer that creates a regular sequence of pitch patterns, e.g., at floorplan time. For each track, $\alpha_j$ and/or $\beta_k$ may be adjusted opportunistically to optimize net resistance, net capacitance, signal integrity, IR drop, electromigration, etc.

Recall that a routing layer may include any number of track sets (e.g., two or more), with each track set comprising a plurality of tracks. For example, FIG. 3, the routing layer 300 is illustrated as including three track sets –310, 320, 330. Track set 310 may include a plurality of tracks 315 (N1 in this instance), track set 320 may include a plurality of tracks 325 (N2 in this instance), and track set 330 may include a plurality of tracks 335 (also N3 in this instance).

The pitches within the track sets 310, 320, 330 are respectively illustrated to be $P+x_1$, $P+x_2$, $P+x_3$. Also, within track set 310, the widths of tracks 315 are illustrated to be $W+\alpha_1$, the widths of tracks 325 are illustrated to be $W+\alpha_2$, and the widths of tracks 335 are illustrated to be $W+\alpha_3$. Further, within track set 310, the spacings of adjacent tracks 315 are illustrated to be $S+\beta_1$, the widths of tracks 325 are illustrated to be $S+\beta_2$, and the widths of tracks 335 are illustrated to be $S+\beta_3$. Again, it is noted that this is merely an example. The widths of tracks and/or spacings of adjacent tracks within any of the track sets may be same or different.

Note that the spacing between rightmost track 315 of the track set 310 and the leftmost track 325 of the track set 320 is illustrated to be $S+\beta_4$. In general, spacing between edge tracks of adjacent track sets may be different from the spacings within one or both of the adjacent track sets.

Figure 4:
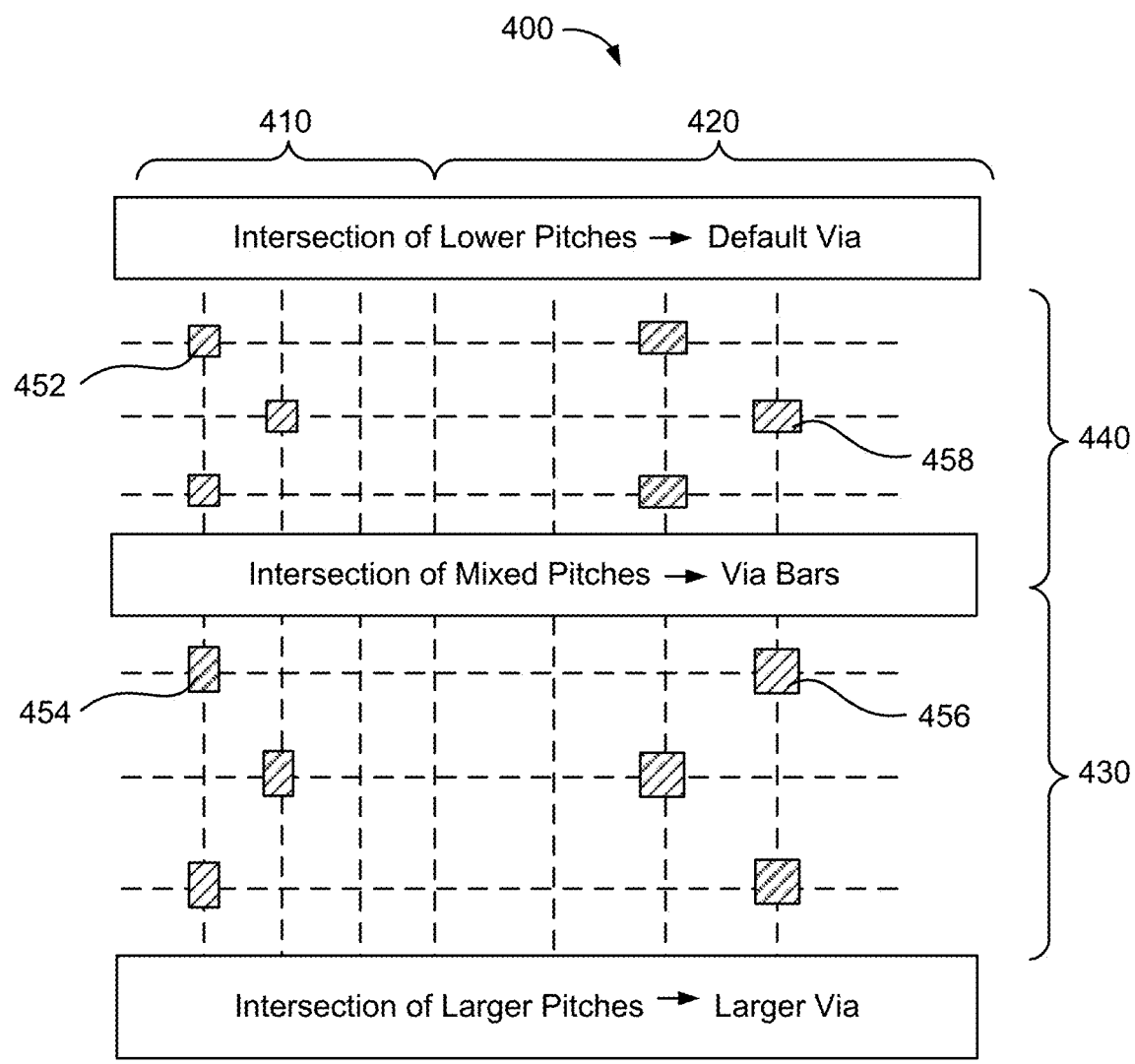

FIG. 4 illustrates an example of multiple routing layers 400 of a semiconductor device with mixed pitches in accordance with one or more aspects of the disclosure. Vertical dashed lines represent track lines of a first routing layer, and horizontal dashed lines represent track lines of track lines of a second routing layer. It may be assumed that there is a track corresponding to each track. However, so as to minimize clutter, the individual tracks themselves are not shown.

In FIG. 4, the first routing layer (layer with vertical track lines) may include first and second track sets 410, 420. Here, the tracks of the first track set 410—the first tracks—may be assumed to have a first width W1, and the tracks of the second track set 420—the second tracks—may be assumed to have a second width W2 greater than the first width W1.

The second routing layer (layer with horizontal track lines) may include third and fourth track sets 430, 440. Here, the tracks of the third track set 430—the third tracks—may be assumed to have a third width W3, and the tracks of the fourth track set 440—the fourth tracks—may be assumed to have a fourth width W4 different from the third width W3.

Using default uniform pitch can pose poses limitations on the choice of via definitions that can be used to connect adjacent layers. Indeed, the size of the via (e.g., in terms of width and/or height) can be primarily constrained by the width of the routing layers it connects and their respective enclosures. However, as will be demonstrated, with the proposed mixed pitch routing layers, more via classes may be defined, which can be opportunistically used at the intersection of enlarged pitches. In this way, reduced via resistance may be leveraged, e.g., for signal, clock and/or power vias.

As seen in FIG. 4, the semiconductor device may also include vias 452, 454, 456, 458 configured to connect adjacent routing layers (e.g., the first routing layer may be above or below the second routing layer). Note that the vias 452 electrically couple first tracks (tracks of the first track set 410) with fourth tracks (tracks of the fourth track set 440) at the intersections between the first and fourth tracks. Then for clarity, vias 452 may also be referred to as first-fourth vias 452 that electrically couple the first tracks with the fourth tracks at the first-third intersections. Then vias 454 may be referred to as first-third vias 454 that electrically couple the first tracks with the third tracks at first-third intersections, vias 456 may be referred to as second-third vias 456 that electrically couple the second tracks with the third tracks at second-third intersections, and vias 458 may be referred to as second-fourth vias 458 that electrically couple the second tracks with the fourth tracks at second-fourth intersections.

In an aspect, sizes of the vias may be proportional to areas of the intersections of the intersecting tracks. In particular, the cross-sectional area of a via may be proportional to an area defined by the widths of the intersecting tracks. For example, a cross-sectional area of a first-fourth via 452 may be proportional to an area defined by the first and fourth widths of the first and fourth tracks, respectively. Similarly, a cross-sectional area of a first-third via 454 may be proportional to an area defined by the first and third widths of the first and third tracks, respectively; a cross-sectional area of a second-third via 456 may be proportional to an area defined by the second and third widths of the second and third tracks, respectively; and a cross-sectional area of a second-fourth via 458 may be proportional to an area defined by the second and fourth widths of the second and fourth tracks, respectively.

If W1<W2, this implies that the cross-sectional area of the second-fourth via 458 is greater than the cross-sectional area of the first-fourth via 452. If W3>W4, this implies that the cross-sectional area of the second-third via 456 is larger than the cross-sectional area of the first-third via 454. If both conditions apply (W1<W2, W3>W4), this implies that the first-fourth via 452 is the smallest and the cross-sectional area of the second-third via 456 is the largest. In an aspect, the larger vias—vias with the larger cross-sectional area such as the second-third vias 456—may be configured to carry signals such as a clock signal, power (e.g., Vdd), or ground (e.g., Vss).

Regarding power, in general, it may be preferred that wider tracks be used to carry first and second power (e.g., Vdd, Vss). In current design implementation flows, typically the power planning stage follows the track assignment, which happens during floor planning. Power delivery networks (PDN) normally follow a regular grid-based approach, with hard constraints determined by: cell height, the gear ratios between the different layers, and global distributed head switch (GDHS) cells strategy. Thus, even in the most general formulation of the methodology, it may be desirable that the track pattern be engineered in such a way that the tracks assigned for the PDN follow a regular pattern. Also, in the case of the PDN nets (Power/GND), it may be preferable that the tracks allocated have as large pitch as possible and/or as large W/S ratio as possible, e.g., for better EMIR.

Figure 5:
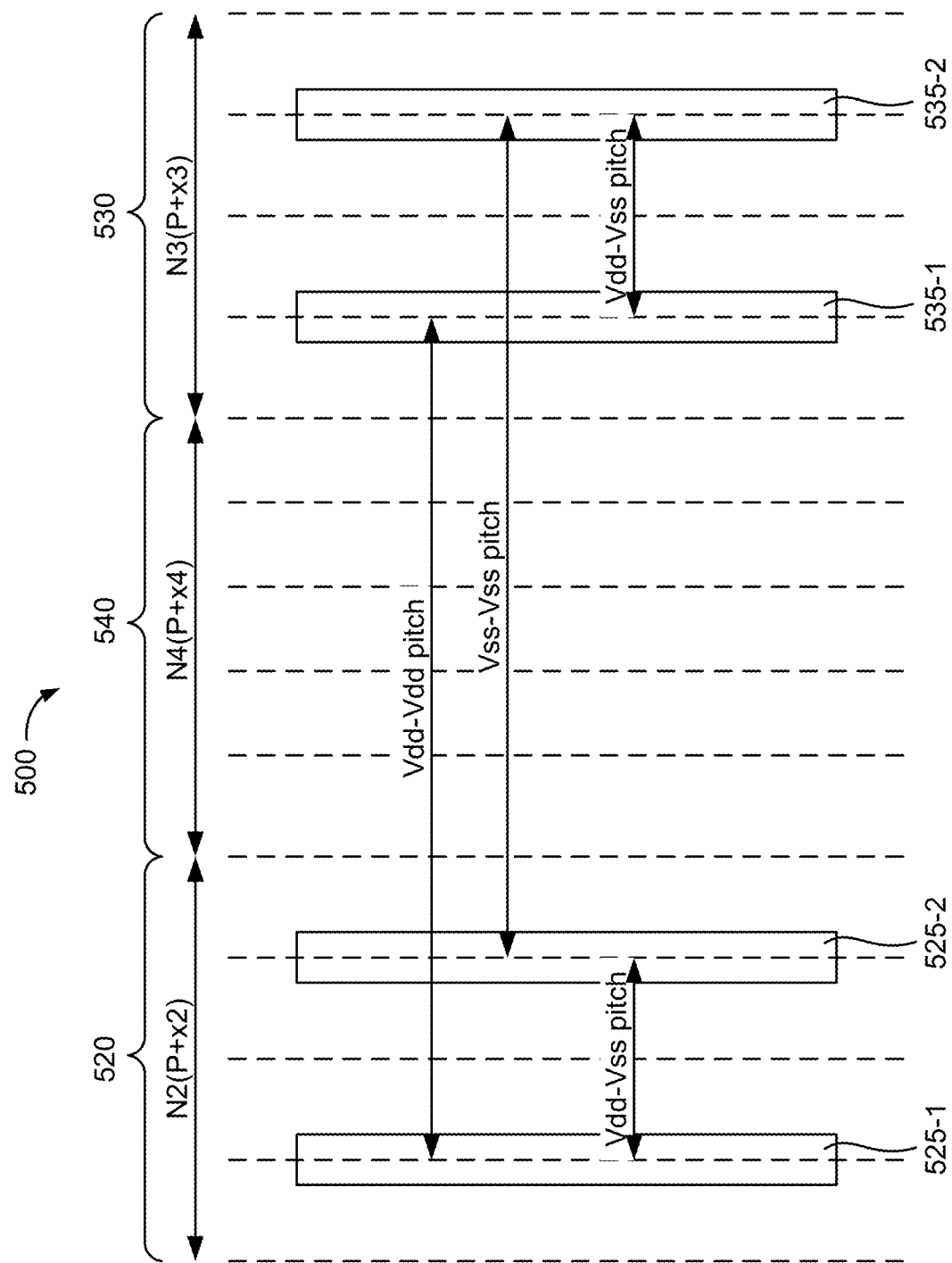

FIG. 5 illustrates an example of a routing layer 500 with mixed pitches in accordance with one or more aspects of the disclosure. The routing layer 500 is illustrated as comprising a track set 520 that includes a large pitch for power and ground, more generally, first and second power. Recall that in FIG. 2, the second pitch of the second track set 220 may be assumed to be greater than the first pitch of the first track set 210, and/or the second width is wider than the first width, and/or the second W/S ratio is greater than the first W/S ratio.

In FIG. 5, the track set 520 is assumed to have a larger pitch, a larger width, and/or a larger W/S ratio than another track set. Thus, for ease of reference, the track set 520 may also be referred to as the second track set 520 that comprises a plurality of second tracks 525. In this instance, one second track 525-1 may be configured carry a first power (e.g., Vdd), and another second track 525-2 may be configured to carry a second power (e.g., Vss). The second track 525-1 configured to carry the first power may be referred to as the first power second, and the second track 525-2 configured to carry the second power may be referred to as the second power second track. While there may be other second tracks, these are not shown for simplicity and to minimize clutter. The track lines corresponding to the second tracks are shown.

The routing layer 500 may also include a third track set 530 (not to be confused with third track set 430 in FIG. 4) that includes a plurality of third tracks. The third track set 530 may be configured similarly to the second track set 520. That is, one third track 535-1—also referred to as first power third track—may be configured carry the first power, and another third track 535-2—also referred to as second power third tack—may be configured to carry the second power. While there may be other third tracks, these are not shown for simplicity and to minimize clutter. The track lines corresponding to the third tracks are shown.

In between the second and third track sets 520, 530, a fourth track set 540 may be included. The fourth track set 540 may include a plurality of fourth tracks. But to minimize clutter, the fourth tracks are not shown. Instead the track lines corresponding to the fourth tracks are shown. In general, the second and third track sets 520, 530 may be separated by one or more other tracks, and the fourth track set 540 is an example of such track sets.

Recall that it may be preferred to have the tracks assigned for the PDN follow a regular pattern. In one aspect, such regularity may be achieved by having the Vdd-Vss pitches within the second and third track sets 520, 530 be the same. That is, the pitch between the first and second power second tracks 525-1, 525-2 (labeled as "Vdd-Vss pitch") may be the same as the pitch between the first and second power third tracks 535-1, 535-2 (also labeled as "Vdd-Vss pitch"). Alternatively, or in addition thereto, a pitch between the first power second track (525-1) and the first power third track (535-1) (labeled as "Vdd-Vdd pitch") may be equal to the pitch between the second power second track (525-2) and the second power third track (535-2) (labeled as "Vss-Vss pitch").

In an aspect, the routing layer 500 may be a first vertical layer of the semiconductor device. Generally, in logic cells, power to devices is typically supplied to power rails in BEOL metal layers. Customarily, M0 layer is viewed as having power lines or tracks running in X-direction (e.g., horizontal direction), and M1 layer is viewed has having lines or tracks running in Y-direction (e.g., vertical direction). Thus, in an aspect, the routing layer 500 may be an example of the M1 layer.

Figure 6:
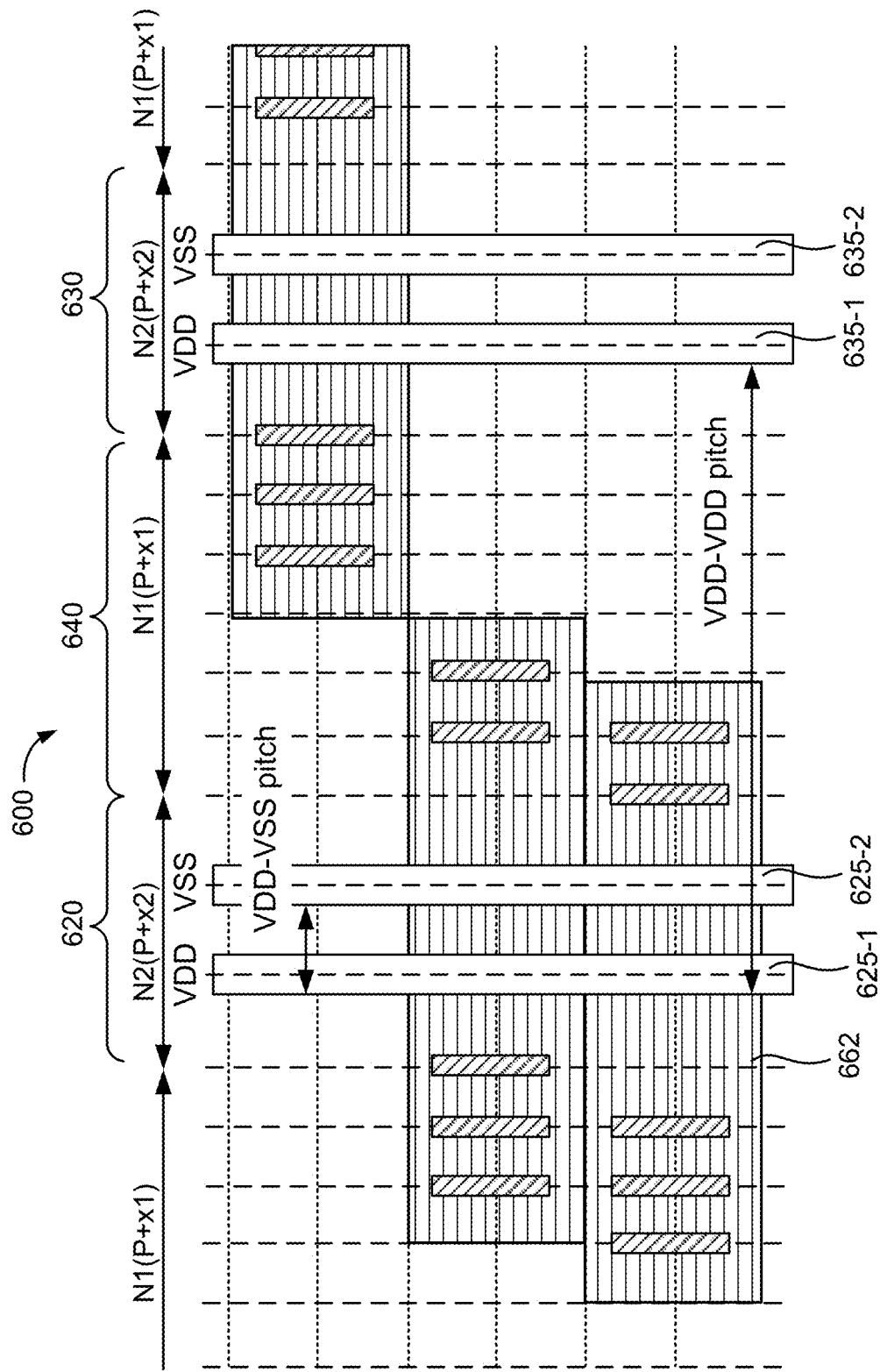

FIG. 6 illustrates yet another example of a routing layer 600 with mixed pitches in accordance with one or more aspects of the disclosure. The routing layer 600 may be similar to the routing layer 500 of FIG. 5. For example, the routing layer 600 may be a first vertical layer of the semiconductor device. As such, the routing layer 600 may include second track set 620, third track set 630, and fourth track set 640 in between. The second track set 620 may include first power second track 625-1 and second power second track 625-2, and the third track set 630 may include first power third track 635-1 and second power third track 635-2.

The semiconductor device may also include one or more cells 662 on the routing layer 600. In an aspect, the mixed pitch within the first and second track sets 620 may imply that that routing layer 600—the first vertical layer—with the enlarged pitch and/or width of the tracks should be considered when designing the cells. For example, in the specific cells whose width is comparable with the PDN pitch may be designed by taking into account the "porosity" to the enlarged pitch for the PDN tracks, e.g., to minimize the area loss. This may be achieved allowing sufficient gap in the middle of the cells between the pins or obstructions in the first vertical layer. Possibly, multiple variants of the largest cells may be designed, e.g., to offer further flexibility during placement legalization.

In an aspect buried power rails (BPR) may be used to provide connection to power (e.g., Vdd, Vss) signals. A high aspect ratio BPR in shallow trench isolation (STI) is an efficient way to reduce IR-drop, e.g., in state of the art CPUs. However, horizontal buried power may need to be access through a special tap cell—a BPR tap cell—that provides a connection between the BPR and the rest of the power mesh. A reduced spacing of these tap cells can cause a severe area penalty, and therefore compromise the benefits of the BPR solution. However, in the proposed approach, a non-default contact-to-diffusion (CD) rail in conjunction with BPR columns can allow a relaxation of the Vertical PDN Pitch. This in turn can offer a low resistive paths for the first horizontal (e.g., M0) and vertical (e.g., M1) layers, and thus limit the real-estate dedicated to access the BPR.

Figure 7:
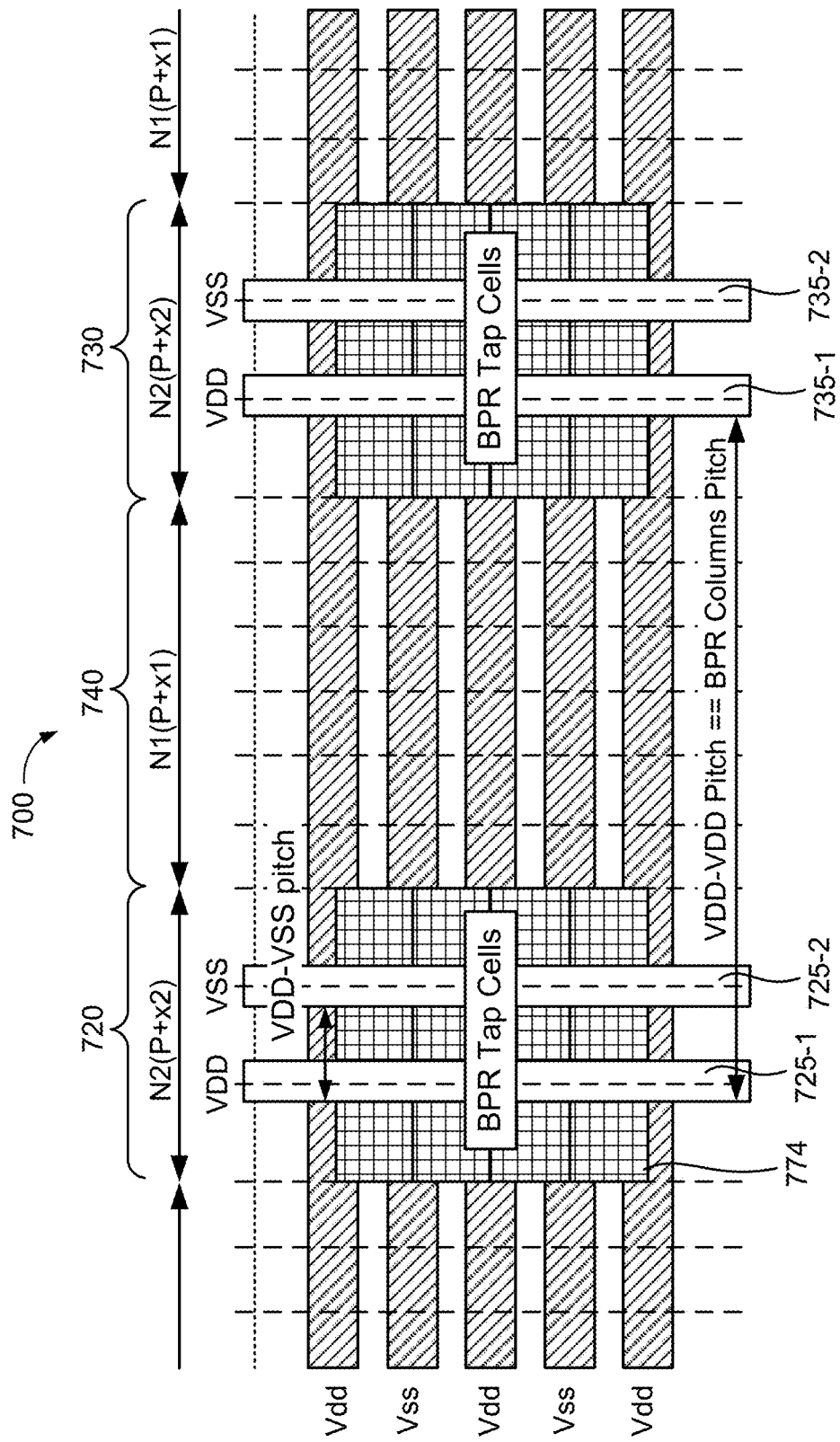

FIG. 7 illustrates another example of multiple routing layers 700 of a semiconductor device with mixed pitches. Here, vertically oriented dashed lines and tracks may represent tracks and track lines of a first vertical layer (e.g., M1 layer), and horizontal tracks may represent tracks of a horizontal power layer (e.g., M0 layer). In FIG. 7, the tracks of the horizontal power layer may comprise power rails—first power rails configured to carry the first power signal (e.g., Vdd) and second power rails configured to carry the second power signal (e.g., Vss).

The first vertical layer of the semiconductor device may be similar to the routing layer 500 of FIG. 5 and/or of the routing layer 600 of FIG. 6. As such, the first vertical layer may include second track set 720, third track set 730, and fourth track set 740 in between. The second track set 720 may include first power second track 725-1 and second power second track 725-2, and the third track set 730 may include first power third track 735-1 and second power third track 735-2.

The semiconductor device may also comprise one or more BPR tap cells 774 configured to electrically couple with the horizontal power layer and with the first power second track 725-1, the second power second track 725-2, the first power third track 735-1 and the second power third track 735-2. In particular, the first power second track 725-1 may be configured to electrically couple with one or more first power rails (of the horizontal power layer) through one or more BPR tap cells 774, and the second power second track 725-2 may be configured to electrically couple with one or more second power rails (of the horizontal power layer) through one or more BPR tap cells 774. Alternatively, or in addition thereto, the first power third track 735-1 may be configured to electrically couple with one or more first power rails through one or more BPR tap cells 774, and the second power third track 735-2 may be configured to electrically couple with one or more second power rails through one or more BPR tap cells 774.

Figure 8A:
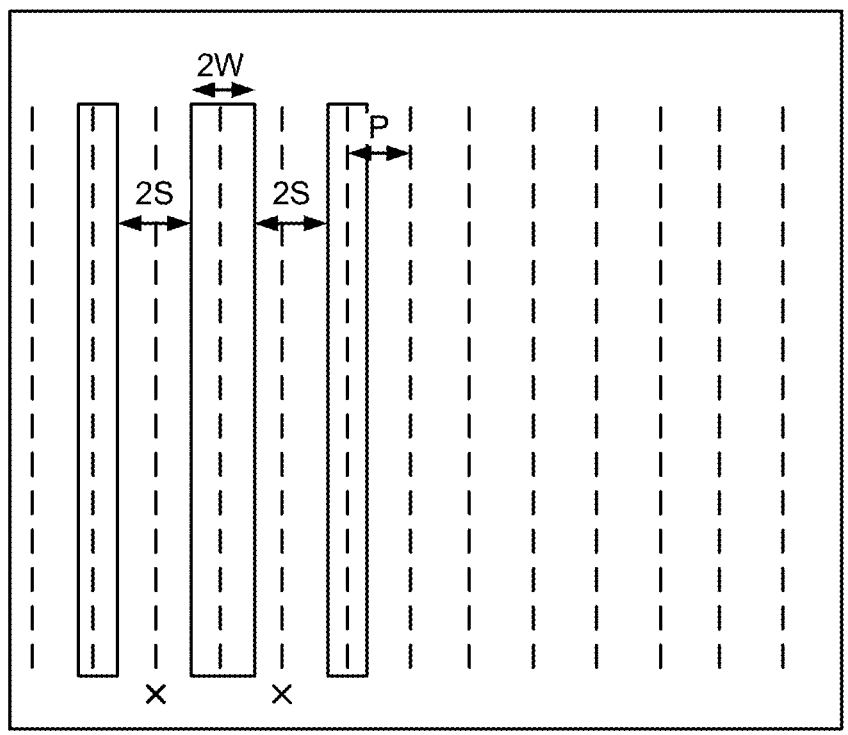
FIGS. 8A and 8B illustrate relative loss in real estate when routing for electrically critical nets in accordance with one or more aspects of the disclosure.

One (of which there can be several) technical advantage of the proposed mixed pitch approach is that less real estate is lost when handling important signals. For example, Electrically critical nets (e.g., clock nets) have been traditionally handled through the usage of non-default rules (NDRs), that force the usage of multiple width and/or multiple spacing on a given class of nets. This is illustrated FIG. 8A. As seen, the conventional 2 W-2S NDR approach require three routing tracks rather than one.

Figure 8B:
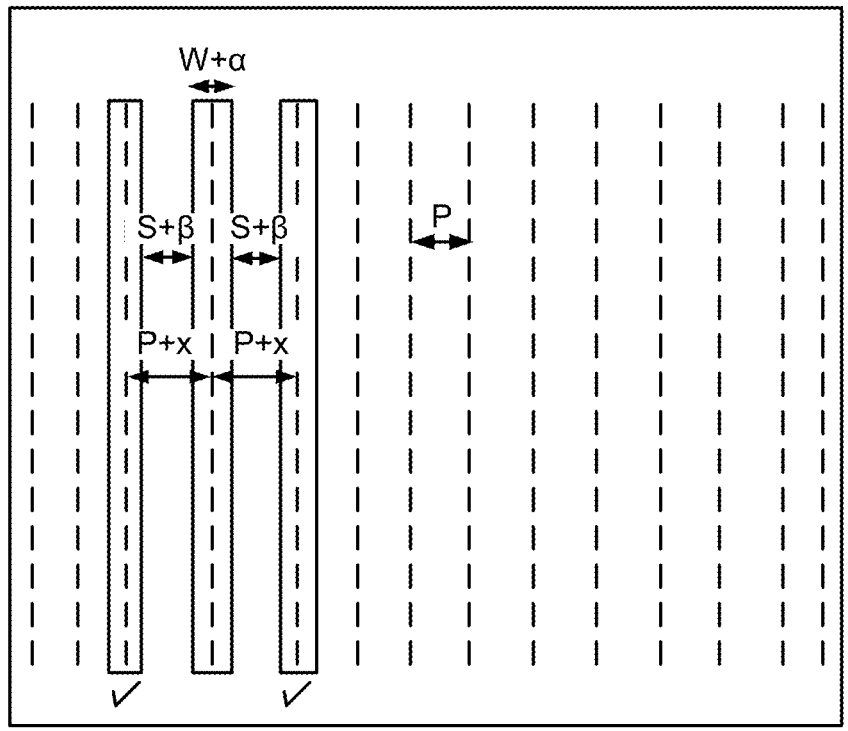

On the other hand, as seen in FIG. 8B, the proposed mixed pitch approach offers a more flexible tuning of the pitch, width and spacing that does NOT imply any additional track loss. While the mixed approach does mean that some area loss occurs when compared to the minimum pitch P, it is not as severe as the loss occurred with the conventional approach.

Figure 9:
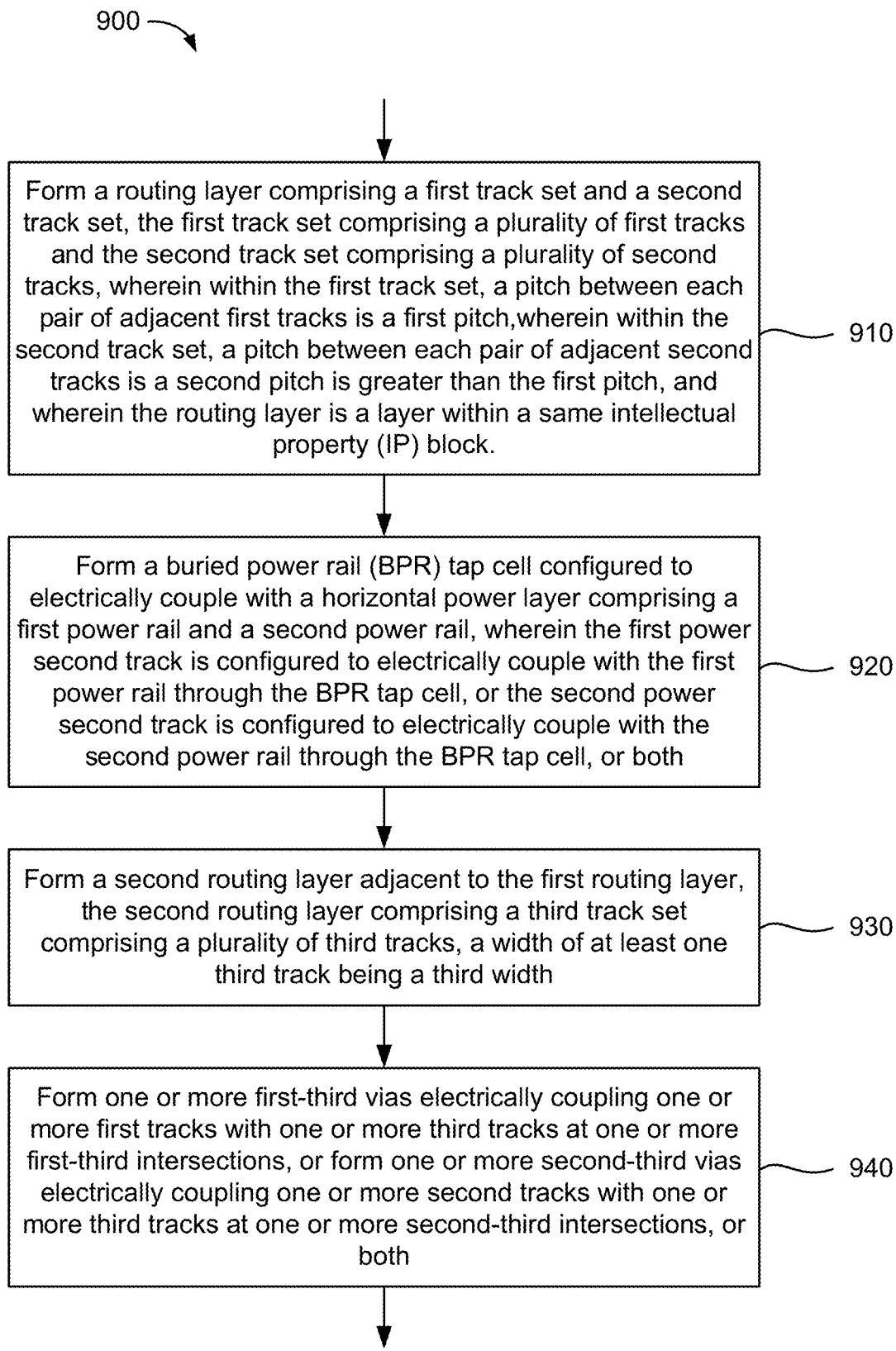
FIG. 9 illustrates a flow chart of an example method of manufacturing a semiconductor device with mixed pitch routing layers in accordance with at one or more aspects of the disclosure.

FIG. 9 illustrates a flow chart of an example method 900 of fabricating a semiconductor device such as any of the semiconductor devices with routing layers of FIGS. 3-7. In block 910, a routing layer comprising a first track set and a second track set may be formed. The first track set may comprise a plurality of first tracks and the second track set may comprise a plurality of second tracks. Within the first track set, a pitch between each pair of adjacent first tracks may be a first pitch. Within the second track set, a pitch between each pair of adjacent second tracks may be a second pitch is greater than the first pitch. The routing layer may be a layer within a same intellectual property (IP) block. The routing layer may be any of the routing layers described with respect to FIGS. 3-7.

In block 920, a buried power rail (BPR) tap cell may be formed. The BPR tap cell may be configured to electrically couple with a horizontal power layer comprising a first power rail and a second power rail. The first power second track may be configured to electrically couple with the first power rail through the BPR tap cell, or the second power second track may be configured to electrically couple with the second power rail through the BPR tap cell, or both. E.g., see FIG. 7.

In block 930, a second routing layer adjacent to the first routing layer may be formed. The second routing layer may comprise a third track set comprising a plurality of third tracks, a width of at least one third track being a third width. Thereafter, in block 940, one or more first-third vias, or one or more second-third vias, or both may be formed. The one or more first-third vias may electrically couple one or more first tracks with one or more third tracks at one or more first-third intersections. The one or more second-third vias may electrically couple one or more second tracks with one or more third tracks at one or more second-third intersections. E.g., see FIG. 4.

It will be appreciated that the foregoing fabrication processes and related discussion were provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations. Further, it will be appreciated that the illustrated configurations and descriptions are provided merely to aid in the explanation of the various aspects disclosed herein. For example, the number and location of the metal-insulator-metal (MIM) capacitors and/or inductors, the metallization structure may have more or less conductive and insulating layers, the cavity orientation, size, whether it is formed of multiple cavities, is closed or open, and other aspects may have variations driven by specific application design features, such as the number of antennas, antenna type, frequency range, power, etc. Accordingly, the forgoing illustrative examples and associated figures should not be construed to limit the various aspects disclosed and claimed herein.

Figure 10:
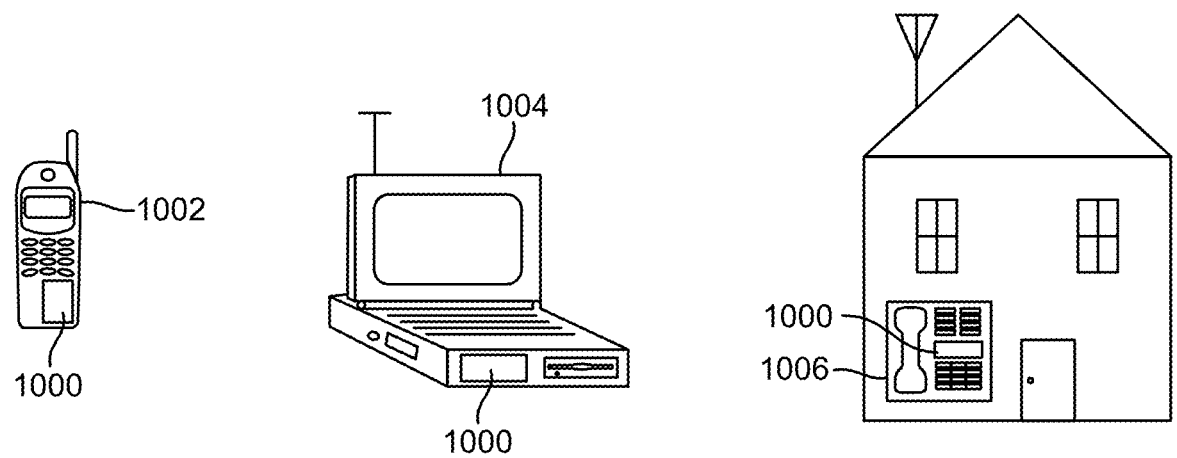
FIG. 10 illustrates various electronic devices which may utilize one or more aspects of the disclosure.

FIG. 10 illustrates various electronic devices that may be integrated with any of the aforementioned semiconductor devices in accordance with various aspects of the disclosure. For example, a mobile phone device 1002, a laptop computer device 1004, and a fixed location terminal device 1006 may each be considered generally user equipment (UE) and may include the semiconductor device 1000 with mixed pitch routing layers as described herein. The devices 1002, 1004, 1006 illustrated in FIG. 10 are merely exemplary. Other electronic devices may also include the RF filter including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media.

Some or all such files may be provided to fabrication handlers who fabricate devices based on such files. Resulting products may include semiconductor wafers that are then cut into semiconductor die and packaged into a semiconductor device. The semiconductor device may then be employed in devices described herein.

Implementation examples are described in the following numbered clauses:

Clause 1: A semiconductor device, comprising: a routing layer comprising a first track set and a second track set, the first track set comprising a plurality of first tracks and the second track set comprising a plurality of second tracks, wherein within the first track set, a pitch between each pair of adjacent first tracks is a first pitch, wherein within the second track set, a pitch between each pair of adjacent second tracks is a second pitch greater than the first pitch, and wherein the routing layer is a layer within a same intellectual property (IP) block.

Clause 2: The semiconductor device of clause 1, wherein the first pitch is P+x1 and second pitch is P+x2, P being a minimum pitch and 0<x1<x2<P.

Clause 3: The semiconductor device of any of clauses 1-2, wherein within the second track set, a first power second track is configured to carry a first power and a second power second track is configured to carry a second power, wherein the routing layer further comprises a third track set comprising a plurality of third tracks including first and second power third tracks, the first power third track being configured to carry the first power and the second power third track being configured to carry the second power, wherein the first and third track sets are separated by one or more track sets, and wherein a pitch between the first and second power second tracks is equal to a pitch between the first and second power third tracks.

Clause 4: The semiconductor device of clause 3, wherein a pitch between the first power second track and the first power third track is equal to a pitch between the second power second track and the second power third track.

Clause 5: The semiconductor device of any of clauses 3-4, further comprising: a buried power rail (BPR) tap cell configured to electrically couple with a power layer comprising a first power rail and a second power rail, wherein the first power second track is configured to electrically couple with the first power rail through the BPR tap cell, or the second power second track is configured to electrically couple with the second power rail through the BPR tap cell, or both.

Clause 6: The semiconductor device of any of clauses 1-5, wherein within the first track set, a width of at least one first track is a first width, and wherein within the second track set, a width of at least one second track is a second width wider than the first width. Clause 7: The semiconductor device of clause 6, wherein within the first track set, the first width is different from another first width, the another first width being a width of another first track, or wherein within the second track set, the second width is different from another second width, the another second width being a width of another second track, or both.

Clause 8: The semiconductor device of any of clauses 6-7, wherein the routing layer is a first routing layer, wherein the semiconductor device further comprises a second routing layer adjacent to the first routing layer, the second routing layer comprising a third track set comprising a plurality of third tracks, a width of at least one third track being a third width, wherein the plurality of first tracks and the plurality of second tracks of the first routing layer are oriented in a first direction, wherein the plurality of third tracks of the second routing layer are oriented in a second direction different from the first direction, wherein the semiconductor device further comprises: one or more first-third vias electrically coupling one or more first tracks with one or more third tracks at one or more first-third intersections, or one or more second-third vias electrically coupling one or more second tracks with one or more third tracks at one or more second-third intersections, or both, and wherein a cross-sectional area of at least one first-third via is proportional to an area defined by the first and third widths and a cross-sectional area of at least one second-third via is proportional to an area defined by the second and third widths.

Clause 9: The semiconductor device of clause 8, wherein the cross-sectional area of the at least one second-third via is greater than the cross-sectional area of the at least one first-third via, and wherein the at least one second-third via configured to be used to carry clock signal, power, or ground.

Clause 10: The semiconductor device of any of clauses 1-9, wherein within the first track set, a spacing between at least one pair of adjacent first tracks is a first spacing, and wherein within the second track set, a spacing between at least one pair of adjacent second tracks is a second spacing greater than the first spacing.

Clause 11: The semiconductor device of clause 10, wherein within the first track set, the first spacing is different from another first spacing, the another first spacing being a spacing between another pair of adjacent first tracks, or wherein within the second track set, the second spacing is different from another second spacing, the another second spacing being a spacing between another pair of adjacent second tracks, or both.

Clause 12: The semiconductor device of any of clauses 1-11, wherein within the first track set, a width/spacing (W/S) ratio of at least one first track is a first W/S ratio, wherein within the second track set, a W/S ratio of at least one second track is a second W/S ratio greater than the first W/S ratio, and wherein a W/S ratio of a track is a ratio of a width of the track to a spacing between the track and an adjacent track.

Clause 13: The semiconductor device of clause 12, wherein within the first track set, the first W/S ratio is different from another first W/S ratio, the another first W/S ratio being a W/S ratio of another first track, or wherein within the second track set, the second W/S ratio is different from another second W/S ratio, the another second W/S ratio being a W/S ratio of another second track, or both.

Clause 14: The semiconductor device of any of clauses 1-13, wherein the IP block is a subsystem of a system-on-chip (SoC).

Clause 15: A method of fabricating a semiconductor device, the method comprising: forming a routing layer comprising a first track set and a second track set, the first track set comprising a plurality of first tracks and the second track set comprising a plurality of second tracks, wherein within the first track set, a pitch between each pair of adjacent first tracks is a first pitch, wherein within the second track set, a pitch between each pair of adjacent second tracks is a second pitch greater than the first pitch, and wherein the routing layer is a layer within a same intellectual property (IP) block.

Clause 16: The method of clause 15, wherein the first pitch is P+x1 and second pitch is P+x2, P being a minimum pitch and 0<x1<x2<P.

Clause 17: The method of any of clauses 15-16, wherein within the second track set, a first power second track is configured to carry a first power and a second power second track is configured to carry a second power, wherein the routing layer further comprises a third track set comprising a plurality of third tracks including first and second power third tracks, the first power third track being configured to carry the first power and the second power third track being configured to carry the second power, wherein the first and third track sets are separated by one or more track sets, and wherein a pitch between the first and second power second tracks is equal to a pitch between the first and second power third tracks.

Clause 18: The method of clause 17, wherein a pitch between the first power second track and the first power third track is equal to a pitch between the second power second track and the second power third track.

Clause 19: The method of any of clauses 15-18, wherein within the first track set, a width of at least one first track is a first width, and wherein within the second track set, a width of at least one second track is a second width wider than the first width.

Clause 20: The method of clause 19, wherein within the first track set, the first width is different from another first width, the another first width being a width of another first track, or wherein within the second track set, the second width is different from another second width, the another second width being a width of another second track, or both.

Clause 21: The method of any of clauses 19-20, wherein the routing layer is a first routing layer, wherein the method further comprises forming a second routing layer adjacent to the first routing layer, the second routing layer comprising a third track set comprising a plurality of third tracks, a width of at least one third track being a third width, wherein the plurality of first tracks and the plurality of second tracks of the first routing layer are oriented in a first direction, wherein the plurality of third tracks of the second routing layer are oriented in a second direction different from the first direction, wherein the method further comprises: forming one or more first-third vias electrically coupling one or more first tracks with one or more third tracks at one or more first-third intersections, or forming one or more second-third vias electrically coupling one or more second tracks with one or more third tracks at one or more second-third intersections, or both, and wherein a cross-sectional area of at least one first-third via is proportional to an area defined by the first and third widths and a cross-sectional area of at least one second-third via is proportional to an area defined by the second and third widths.

Clause 22: The method of clause 21, wherein the cross-sectional area of the at least one second-third via is greater than the cross-sectional area of the at least one first-third via, and wherein the at least one second-third via configured to be used to carry clock signal, power, or ground.

Clause 23: The method of any of clauses 15-22, wherein within the first track set, a spacing between at least one pair of adjacent first tracks is a first spacing, and wherein within the second track set, a spacing between at least one pair of adjacent second tracks is a second spacing greater than the first spacing.

Clause 24: The method of any of clauses 15-23, wherein within the first track set, a width/spacing (W/S) ratio of at least one first track is a first W/S ratio, wherein within the second track set, a W/S ratio of at least one second track is a second W/S ratio greater than the first W/S ratio, and wherein a W/S ratio of a track is a ratio of a width of the track to a spacing between the track and an adjacent track.

Clause 25: The method of any of clauses 15-24, wherein the IP block is a subsystem of a system-on-chip (SoC).

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that-although a dependent claim can refer in the claims to a specific combination with one or one or more claims-other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A semiconductor device, comprising: a routing layer comprising a first track set and a second track set, the first track set comprising a plurality of first tracks and the second track set comprising a plurality of second tracks, wherein within the first track set, a pitch between each pair of adjacent first tracks is a first pitch, wherein within the second track set, a pitch between each pair of adjacent second tracks is a second pitch greater than the first pitch, and wherein the routing layer is a layer within a same intellectual property (IP) block, and wherein within the first track set, a width/spacing (W/S) ratio of at least one first track is a first W/S ratio, wherein within the second track set, a W/S ratio of at least one second track is a second W/S ratio different than the first W/S ratio, and wherein a W/S ratio of a track is a ratio of a width of the track to a spacing between the track and an adjacent track.

2. The semiconductor device of claim 1, wherein the first pitch is P+x1 and second pitch is P+x2, P being a minimum pitch and 0<x1<x2<P.

3. The semiconductor device of claim 1, wherein within the second track set, a first power second track is configured to carry a first power and a second power second track is configured to carry a second power, wherein the routing layer further comprises a third track set comprising a plurality of third tracks including first and second power third tracks, the first power third track being configured to carry the first power and the second power third track being configured to carry the second power, wherein the first and third track sets are separated by one or more track sets, and wherein a pitch between the first and second power second tracks is equal to a pitch between the first and second power third tracks.

4. The semiconductor device of claim 3, wherein a pitch between the first power second track and the first power third track is equal to a pitch between the second power second track and the second power third track.

5. The semiconductor device of claim 3, further comprising: a buried power rail (BPR) tap cell configured to electrically couple with a power layer comprising a first power rail and a second power rail, wherein the first power second track is configured to electrically couple with the first power rail through the BPR tap cell, or the second power second track is configured to electrically couple with the second power rail through the BPR tap cell, or both.

6. The semiconductor device of claim 1, wherein within the first track set, a width of at least one first track is a first width, and wherein within the second track set, a width of at least one second track is a second width wider than the first width.

7. The semiconductor device of claim 6, wherein within the first track set, the first width is different from another first width, the another first width being a width of another first track, or wherein within the second track set, the second width is different from another second width, the another second width being a width of another second track, or both.

8. The semiconductor device of claim 6, wherein the routing layer is a first routing layer, wherein the semiconductor device further comprises a second routing layer adjacent to the first routing layer, the second routing layer comprising a third track set comprising a plurality of third tracks, a width of at least one third track being a third width, wherein the plurality of first tracks and the plurality of second tracks of the first routing layer are oriented in a first direction, wherein the plurality of third tracks of the second routing layer are oriented in a second direction different from the first direction, wherein the semiconductor device further comprises: one or more first-third vias electrically coupling one or more first tracks with one or more third tracks at one or more first-third intersections, or one or more second-third vias electrically coupling one or more second tracks with one or more third tracks at one or more second-third intersections, or both, and wherein a cross-sectional area of at least one first-third via is proportional to an area defined by the first and third widths and a cross-sectional area of at least one second-third via is proportional to an area defined by the second and third widths.

9. The semiconductor device of claim 8, wherein the cross-sectional area of the at least one second-third via is greater than the cross-sectional area of the at least one first-third via, and wherein the at least one second-third via configured to be used to carry clock signal, power, or ground.

10. The semiconductor device of claim 1, wherein within the first track set, a spacing between at least one pair of adjacent first tracks is a first spacing, and wherein within the second track set, a spacing between at least one pair of adjacent second tracks is a second spacing greater than the first spacing.

11. The semiconductor device of claim 10, wherein within the first track set, the first spacing is different from another first spacing, the another first spacing being a spacing between another pair of adjacent first tracks, or wherein within the second track set, the second spacing is different from another second spacing, the another second spacing being a spacing between another pair of adjacent second tracks, or both.

12. The semiconductor device of claim 1, wherein within the first track set, the first W/S ratio is different from another first W/S ratio, the another first W/S ratio being a W/S ratio of another first track, or wherein within the second track set, the second W/S ratio is different from another second W/S ratio, the another second W/S ratio being a W/S ratio of another second track, or both.

13. The semiconductor device of claim 1, wherein the IP block is a subsystem of a system-on-chip (SoC).

14. A method of fabricating a semiconductor device, the method comprising: forming a routing layer comprising a first track set and a second track set, the first track set comprising a plurality of first tracks and the second track set comprising a plurality of second tracks, wherein within the first track set, a pitch between each pair of adjacent first tracks is a first pitch, wherein within the second track set, a pitch between each pair of adjacent second tracks is a second pitch greater than the first pitch, and wherein the routing layer is a layer within a same intellectual property (IP) block, wherein within the first track set, a width of at least one first track is a first width, and wherein within the second track set, a width of at least one second track is a second width wider than the first width, and wherein within the first track set, the first width is different from another first width, the another first width being a width of another first track, or wherein within the second track set, the second width is different from another second width, the another second width being a width of another second track, or both.

15. The method of claim 14, wherein the first pitch is P+x1 and second pitch is P+x2, P being a minimum pitch and 0<x1<x2<P.

16. The method of claim 14, wherein within the second track set, a first power second track is configured to carry a first power and a second power second track is configured to carry a second power, wherein the routing layer further comprises a third track set comprising a plurality of third tracks including first and second power third tracks, the first power third track being configured to carry the first power and the second power third track being configured to carry the second power, wherein the first and third track sets are separated by one or more track sets, and wherein a pitch between the first and second power second tracks is equal to a pitch between the first and second power third tracks.

17. The method of claim 16, wherein a pitch between the first power second track and the first power third track is equal to a pitch between the second power second track and the second power third track.

18. The method of claim 14, wherein the routing layer is a first routing layer, where the method further comprises forming a second routing layer adjacent to the first routing layer, the second routing layer comprising a third track set comprising a plurality of third tracks, a width of at least one third track being a third width, wherein the plurality of first tracks and the plurality of second tracks of the first routing layer are oriented in a first direction, wherein the plurality of third tracks of the second routing layer are oriented in a second direction different from the first direction, wherein the method further comprises: forming one or more first-third vias electrically coupling one or more first tracks with one or more third tracks at one or more first-third intersections, or forming one or more second-third vias electrically coupling one or more second tracks with one or more third tracks at one or more second-third intersections, or both, and wherein a cross-sectional area of at least one first-third via is proportional to an area defined by the first and third widths and a cross-sectional area of at least one second-third via is proportional to an area defined by the second and third widths.

19. The method of claim 18, wherein the cross-sectional area of the at least one second-third via is greater than the cross-sectional area of the at least one first-third via, and wherein the at least one second-third via configured to be used to carry clock signal, power, or ground.

20. The method of claim 14, wherein within the first track set, a spacing between at least one pair of adjacent first tracks is a first spacing, and wherein within the second track set, a spacing between at least one pair of adjacent second tracks is a second spacing greater than the first spacing.

21. The method of claim 14, wherein within the first track set, a width/spacing ratio (W/S ratio) of at least one first track is a first W/S ratio, wherein within the second track set, a W/S ratio of at least one second track is a second W/S ratio, and wherein a W/S ratio of a track is a ratio of a width of the track to a spacing between the track and an adjacent track.

22. The method of claim 14, wherein the IP block is a subsystem of a system-on-chip (SoC).

23. A semiconductor device, comprising: a routing layer comprising a first track set and a second track set, the first track set comprising a plurality of first tracks and the second track set comprising a plurality of second tracks, wherein within the first track set, a pitch between each pair of adjacent first tracks is a first pitch, wherein within the second track set, a pitch between each pair of adjacent second tracks is a second pitch greater than the first pitch, and wherein the routing layer is a layer within a same intellectual property (IP) block, and wherein within the first track set, a width of at least one first track is a first width, and wherein within the second track set, a width of at least one second track is a second width wider than the first width, and_wherein within the first track set, the first width is different from another first width, the another first width being a width of another first track, or wherein within the second track set, the second width is different from another second width, the another second width being a width of another second track, or both.

24. A semiconductor device, comprising: a routing layer comprising a first track set and a second track set, the first track set comprising a plurality of first tracks and the second track set comprising a plurality of second tracks, wherein within the first track set, a pitch between each pair of adjacent first tracks is a first pitch, wherein within the second track set, a pitch between each pair of adjacent second tracks is a second pitch greater than the first pitch, and wherein the routing layer is a layer within a same intellectual property (IP) block, and wherein within the first track set, a spacing between at least one pair of adjacent first tracks is a first spacing, and wherein within the second track set, a spacing between at least one pair of adjacent second tracks is a second spacing greater than the first spacing, and wherein within the first track set, the first spacing is different from another first spacing, the another first spacing being a spacing between another pair of adjacent first tracks, or wherein within the second track set, the second spacing is different from another second spacing, the another second spacing being a spacing between another pair of adjacent second tracks, or both.

\* \* \* \* \*